(12) United States Patent
Li et al.

(10) Patent No.: US 7,639,069 B2
(45) Date of Patent: Dec. 29, 2009

(54) TUNABLE BALANCED LOSS COMPENSATION IN AN ELECTRONIC FILTER

(75) Inventors: Shaorui Li, Summit, NJ (US); John Thomas Bayruns, Bridgewater, NJ (US)

(73) Assignee: Anadigics, Inc., Warren, NJ (US)

( * ) Notice: Subject to any disclaimer, the term of this patent is extended or adjusted under 35 U.S.C. 154(b) by 44 days.

(21) Appl. No.: 12/151,699

(22) Filed: May 8, 2008

(65) Prior Publication Data

US 2008/0211573 A1 Sep. 4, 2008

Related U.S. Application Data

(63) Continuation of application No. 11/360,257, filed on Feb. 23, 2006, now abandoned.

(51) Int. Cl.
*H03B 1/00* (2006.01)
(52) U.S. Cl. ........................................ 327/551; 327/552
(58) Field of Classification Search ................. None
See application file for complete search history.

(56) References Cited

U.S. PATENT DOCUMENTS

| | | | |
|---|---|---|---|
| 5,625,317 A * | 4/1997 | Deveirman | 327/553 |
| 6,335,655 B1 * | 1/2002 | Yamamoto | 327/552 |
| 6,466,090 B1 * | 10/2002 | Giuroiu | 330/86 |
| 7,002,403 B2 * | 2/2006 | Marholev | 327/552 |
| 7,174,143 B1 * | 2/2007 | Turvey | 455/226.1 |
| 7,180,364 B2 * | 2/2007 | Kimura | 327/553 |
| 2002/0005752 A1 * | 1/2002 | Yoon et al. | 327/552 |
| 2002/0011895 A1 * | 1/2002 | Kuo | 327/552 |
| 2002/0011896 A1 * | 1/2002 | Yokoyama et al. | 327/552 |
| 2008/0284505 A1 * | 11/2008 | Okada | 327/554 |

\* cited by examiner

*Primary Examiner*—Tuan Lam
*Assistant Examiner*—Hiep Nguyen
(74) *Attorney, Agent, or Firm*—William L. Botjer

(57) ABSTRACT

The invention provides a system for providing tunable balanced loss compensation in an electronic filter. Tunable balanced loss compensation is provided by using cross-connected balanced transconductors and self-connected balanced transconductors. The cross-connected balanced transconductors and the self-connected transconductors compensate the unbalanced loss across the electronic filter. The self-connected balanced transconductors compensate the balanced loss across the electronic filter. Further, the cross-connected and the self-connected balanced transconductors are tunable by adjusting the values of their transconductances, thereby providing tunable balanced loss compensation.

15 Claims, 4 Drawing Sheets

TUNABLE BALANCED LOSS COMPENSATION IN AN ELECTRONIC FILTER

REFERENCE TO RELATED APPLICATIONS

This application is a continuation of, and claims priority of U.S. patent application Ser. No. 11/360,257 filed Feb. 23, 2006.

BACKGROUND OF THE INVENTION

1. Field of the Invention

The present invention relates generally to the field of electronic filters. More specifically, the present invention relates to a system providing tunable, balanced loss compensation for an unbalanced electronic filter.

2. Description of the Related Art

In communication systems, electronic filters are used for signal processing. Electronic filters eliminate unwanted frequencies from an electronic signal. Different types of electronic filters, such as low-pass filters, band-pass filters, high-pass filters, active filters and passive filters, may be used for this purpose. An electronic filter is usually a combination of inductors and capacitors, referred to as an LC circuit. The electronic filter may include one or more LC circuits and may consist of balanced and unbalanced structures. Examples of balanced structures include balanced LC oscillators and shunt LC resonators. Examples of unbalanced structures include series LC resonators.

The inductors and capacitors in electronic filters have a resistive component that causes losses in the electronic filter during transmission. These losses result in a decrease in the quality of the frequency response provided by the electronic filter. Hence, losses in the electronic filter need to be compensated. Moreover, these losses in the electronic filter may vary with the process, temperature and other factors. Therefore, loss compensation in the electronic filter needs to be tunable, so that it may be adjusted according to the variations in the losses.

Existing methods and systems provide loss compensation for a balanced structure in an electronic filter by using a cross-coupled pair of transistors. This cross-coupled pair of transistors, referred to as a negative resistor, compensates for the resistive losses in a balanced structure. However, the cross-coupled pair of transistors, when used for loss compensation in an unbalanced structure, results in the development of even-order harmonics. These even-order harmonics are undesirable since they distort the frequency response of the electronic filter.

In light of the foregoing discussion, there exists a need for a system to provide tunable loss compensation in an electronic filter. Further, the system provides balanced loss compensation for an unbalanced structure in the electronic filter.

SUMMARY OF THE INVENTION

An object of various embodiments of the invention is to provide a balanced loss compensation for unbalanced and balanced losses in electronic filters.

Another object of various embodiments of the invention is to provide tunable balanced loss compensation in the electronic filters.

To achieve the foregoing objects, in accordance with the purpose of the invention, as broadly described herein, the invention provides a system for providing tunable balanced loss compensation in an electronic filter. The system includes a first set and a second set of transconductors. The first set of transconductors includes at least two cross-connected balanced transconductors, and the second set of transconductors includes at least two self-connected balanced transconductors. The at least two cross-connected balanced transconductors are connected across the balanced input and output ports of the electronic filter. One of the at least two self-connected balanced transconductors is connected between the two terminals of the balanced input port of the electronic filter. Another of the at least two self-connected balanced transconductors is connected between the two terminals of the balanced output port of the electronic filter. The at least two self-connected balanced transconductors compensate the balanced loss across the electronic filter. The at least two self-connected balanced transconductors and the at least two cross-connected balanced transconductors compensate the unbalanced loss across the electronic filter. The loss compensation is tunable by adjusting the transconductances of the at least two cross-connected balanced transconductors and the at least two self-connected balanced transconductors at the design stage of the electronic filter.

BRIEF DESCRIPTION OF THE DRAWINGS

So that the manner in which the above recited features of the present invention can be understood in detail, a more particular description of the invention, briefly summarized above, may be had by reference to various embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Various embodiments of the invention provide a system for loss compensation in an electronic filter. The loss in an electronic filter may be a balanced loss or an unbalanced loss. The type of loss depends on the type of the electronic filter, such as a series LC resonator, a shunt LC resonator, or a combination thereof. The system includes a first set and a second set of transconductors. The first set of transconductors includes at least two cross-connected balanced transconductors, and the second set of transconductors includes at least two self-connected balanced transconductors. The at least two self-connected balanced transconductors compensate the balanced loss across the electronic filter. The at least two self-connected balanced transconductors and the at least two cross-connected balanced transconductors compensate the unbalanced loss across the electronic filter. Further, the at least two cross-connected balanced transconductors and the at least two self-connected balanced transconductors are tunable, thereby providing tunable balanced loss compensation.

Figure 1:
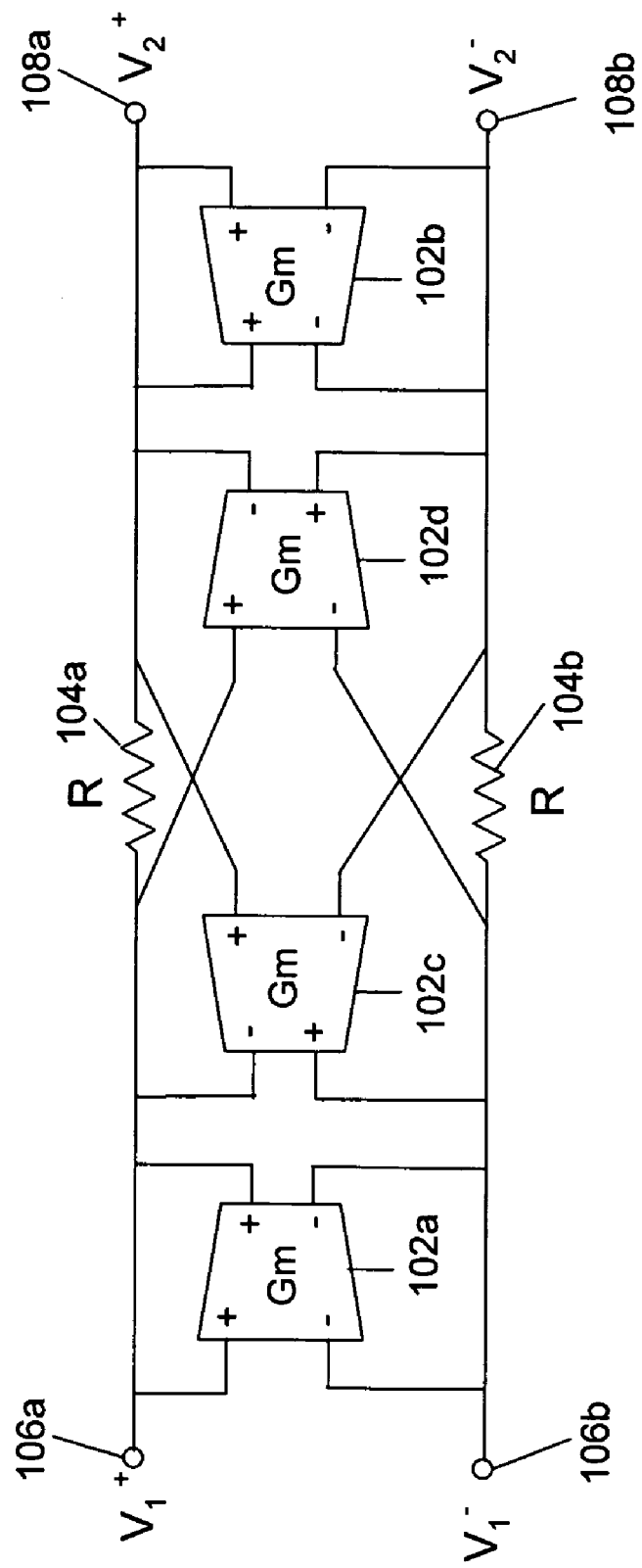
FIG. 1 is a schematic circuit diagram illustrating a system for providing loss compensation, in accordance with an embodiment of the invention.

FIG. 1 is a schematic circuit diagram illustrating a system 100 for providing tunable and balanced loss compensation, in accordance with an embodiment of the invention. System 100 includes at least four transconductors 102a, 102b, 102c, and 102d, and two resistors 104a and 104b. System 100 also includes a differential balanced input port 106 and a differential balanced output port 108. Balanced input port 106 has positive terminal 106a and negative terminal 106b. Balanced output port 108 has positive terminal 108a and negative terminal 108b.

In various embodiments of the invention, system 100 provides tunable and balanced loss compensation in an electronic filter (not shown in FIG. 1). The electronic filter has an unbalanced structure. Signals are provided to the electronic filter through balanced input port 106. Resistors 104a and 104b, as shown in FIG. 1, represent the resistive losses in the electronic filter. Resistor 104a is connected between positive terminal 106a of balanced input port 106 and positive terminal 108a of balanced output port 108 of the electronic filter. Similarly, resistor 104b is connected between negative terminal 106b of balanced input port 106 and negative terminal 108b of balanced output port 108 of the electronic filter.

In one embodiment of the invention, the loss across resistors 104a and 104b is unbalanced since the signals at the two ends of the resistors 104a and 104b are different. In other words, the signals at the two ends of the electronic filter are unsymmetrical.

Transconductors 102a and 102b are Self-Connected Balanced Transconductors (SCBTs). Transconductors 102a and 102b will herein after be referred to as SCBTs 102a and 102b. SCBT 102a is connected across balanced input port 106 of the electronic filter. The positive input of SCBT 102a is connected to positive terminal 106a of balanced input port 106. Similarly, the negative input of SCBT 102a is connected to negative terminal 106b of balanced input port 106. SCBT 102b is connected across balanced output port 108 of the electronic filter, in a similar manner as SCBT 102a.

Transconductors 102c and 102d are Cross-Connected Balanced Transconductors (CCBTs). Transconductors 102c and 102d will herein after be referred to as CCBTs 102c and 102d. CCBTs 102c and 102d are connected across the input and output ports of the electronic filter. The negative output of CCBT 102c is connected to positive terminal 106a of balanced input port 106. The positive output of CCBT 102c is connected to negative terminal 106b of balanced input port 106. In a similar manner, the negative output of CCBT 102d is connected to positive terminal 108a of balanced output port 108. The positive output of CCBT 102d is connected to negative terminal 108b of balanced output port 108.

The four transconductors 102a, 102b, 102c, and 102d provide a tunable balanced loss compensation for the unbalanced loss in the electronic filter. SCBTs 102a and 102b compensate the balanced loss across the electronic filter. SCBTs 102a and 102b and CCBTs 102c and 102d compensate the unbalanced loss across the electronic filter. The concept of providing a balanced loss compensation across an unbalanced structure is explained in conjunction with FIG. 2

Figure 1A:
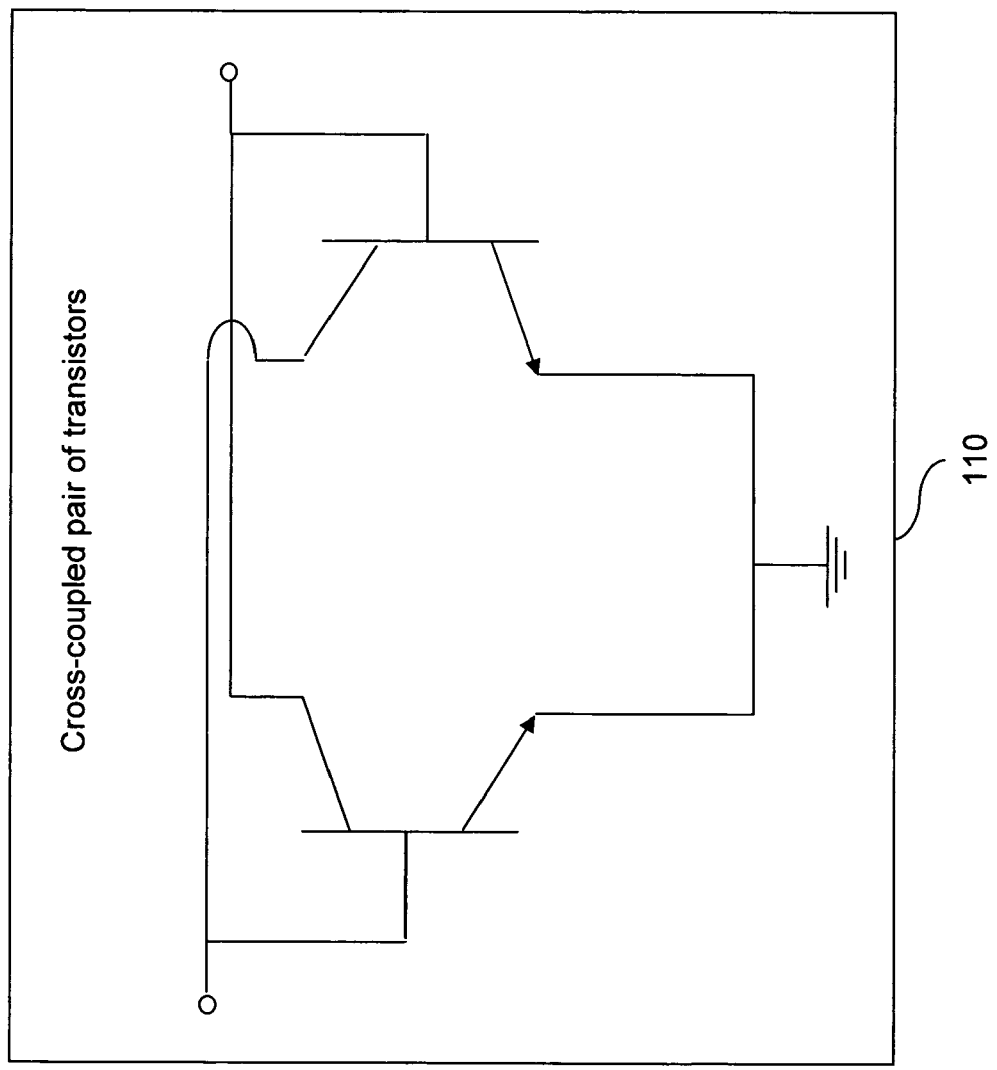
FIG. 1a is a circuit diagram of cross coupled pair of transistors used in the system for providing loss compensation, in accordance with an embodiment of the invention.

In various embodiments of the invention, SCBTs 102a and 102b and CCBTs 102c and 102d include a pair of cross-coupled transistors 110 as shown in FIG. 1a. In other words, the base of one transistor is connected to the collector of the other. Further, the emitters of the two transistors are connected to the ground or a virtual ground. In one embodiment of the invention, the base connections of the two transistors are taken as the positive terminals of a transconductor. The emitters of both the transistors are taken as the negative terminals of the transconductor.

In an embodiment of the invention, the transconductance ($G_m$) of SCBTs 102a and 102b, and CCBTs 102c and 102d compensates the loss in the electronic filter. $G_m$ is the ratio of the change in the output current to the change in the input voltage of transconductor 102. Therefore, $G_m$ is the reciprocal of resistance. In one embodiment of the invention, the $G_m$ of SCBTs 102a and 102b, and CCBTs 102c and 102d may be equal to the reciprocal of resistors 104a and 104b, for ideal loss compensation.

In an embodiment of the invention, the $G_m$ of SCBTs 102a and 102b, and CCBTs 102c and 102d may be adjusted at the design stage of the electronic filter, to provide tunable loss compensation. The $G_m$ of SCBTs 102a and 102b, and CCBTs 102c and 102d are adjusted at the design stage in order to achieve the desired selectivity of frequency response of the electronic filter. In various embodiments of the invention, the $G_m$ of transconductor 102 may be adjusted by altering the biasing condition of the transistors. The biasing condition of the transistors may be altered by adjusting the voltage applied across the positive terminals of the pair of cross-coupled transistors.

In an embodiment of the invention, the SCBTs 102a and 102b, and CCBTs 102c and 102d may have the same transconductance. In another embodiment of the invention, SCBTs 102a and 102b, and CCBTs 102c and 102d may have different transconductance.

In accordance with various embodiments of the invention, the electronic filter may include one or more LC resonators. The LC resonators in the electronic filter may include inductors and varactor diodes, which act as variable capacitors, such as discussed in connection with the circuit illustrated in FIG. 3 for an intermediate frequency filter. An LC resonator has a certain resonant frequency at which the electric current alternates between the inductor and the capacitor. Thus, the LC resonator filters signals around this resonant frequency and functions like an electronic filter.

In various embodiments of the invention, the Q factor of the electronic filter, i.e., the selectivity of the electronic filter's rejection of unwanted signals may be adjusted by changing the transconductances of SCBTs 102a and 102b, and CCBTs 102c and 102d.

In accordance with various embodiments of the invention, the electronic filter may be, for example, a low-pass filter, a high-pass filter, a band-pass filter, a LC filter, and the like.

Figure 2:
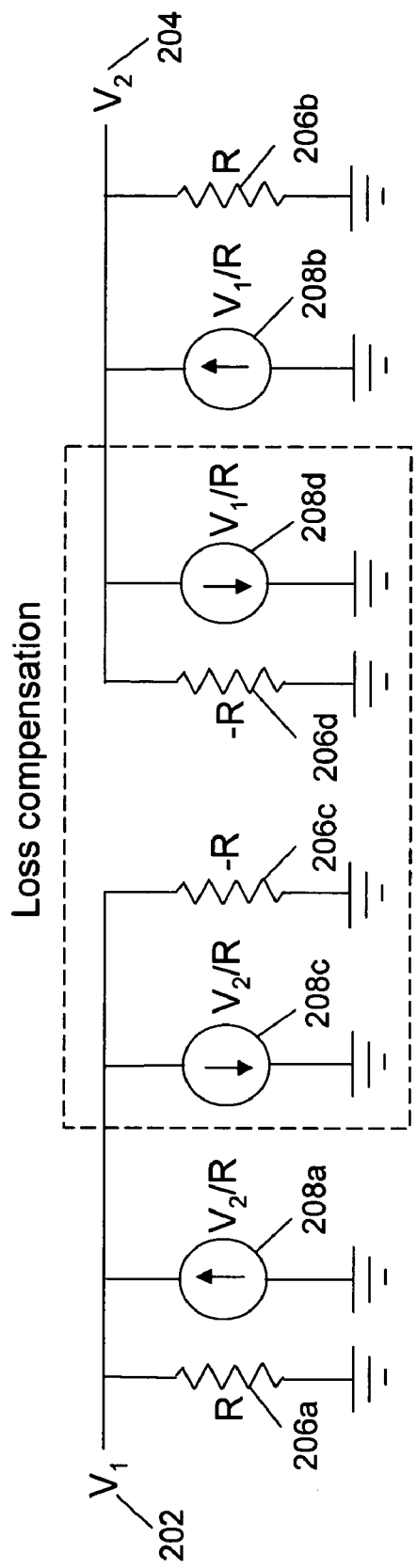
FIG. 2 is a schematic circuit diagram used to illustrate the operation of balanced loss compensation in an unbalanced structure.

FIG. 2 is a schematic circuit diagram used to illustrate the operation of balanced loss compensation in an unbalanced structure. The circuit includes an input port 202, an output port 204, two resistors 206a and 206b, two negative resistances 206c and 206d, and four voltage-controlled-current sources 208a, 208b, 208c and 208d.

Input port 202 may be the input port of an electronic filter such as input port 106. Similarly, output port 204 may be the output port of an electronic filter such as output port 108. Resistors 206a and 206b may represent the resistive losses in the LC resonators in the electronic filter.

Resistors 206a and 206b are connected in series between input port 202 and output port 204. Hence, the loss across resistors 206a and 206b is unbalanced. The resistive loss between two nodes in a circuit may be modeled as a combination of the loss across a resistor and a voltage-controlled current source, connected between each node and the ground. As shown in FIG. 2, the loss across resistor 206 may be split into the losses between input port 202 and the ground, and output port 204 and the ground. The loss between input port 202 and the ground is equivalent to the resistive loss across resistor 206a and voltage-controlled-current source 208a between input port 202 and the ground. Similarly, the loss between output port 204 and the ground is equivalent to the resistive loss across resistor 206b and voltage-controlled-current source 208b between output port 204 and the ground.

The loss between input port 202 and the ground is compensated by connecting a negative resistor 206c and an inverted voltage-controlled-current source 208c to the ground. Similarly, the loss between output port 204 and the ground is compensated by connecting negative resistor 206d and inverted voltage-controlled-current source 208d to the ground. This provides balanced loss compensation for the unbalanced loss in the circuit. A negative resistor is a system, which outputs more energy than the input energy. This is in contrast to a positive resistor, which dissipates the energy passing through it. By way of example, a cross-coupled transistor pair may be a negative resistor.

The loss compensation provided by negative resistors 206 and inverted voltage-controlled-current sources 208 is similar to the loss compensation provided by transconductors 102, in various embodiments of the invention.

The system for providing loss compensation in an electronic filter may be used to compensate the unbalanced loss occurring in an intermediate frequency (IF) filter such as in a double conversion TV tuner.

An Intermediate Frequency (IF) filter is an electronic filter that filters intermediate frequency signals. The range of intermediate frequency signals depends on the specific application. A double-conversion TV tuner tunes television signals. The TV tuner translates radio frequency signals into intermediate frequency (IF) signals and subsequently into the desired lower-frequency signals. The IF filter includes a plurality of LC circuits. Hence, a balanced loss compensation is required. Loss compensation in an IF filter is explained in detail in conjunction with FIG. 3.

Figure 3:
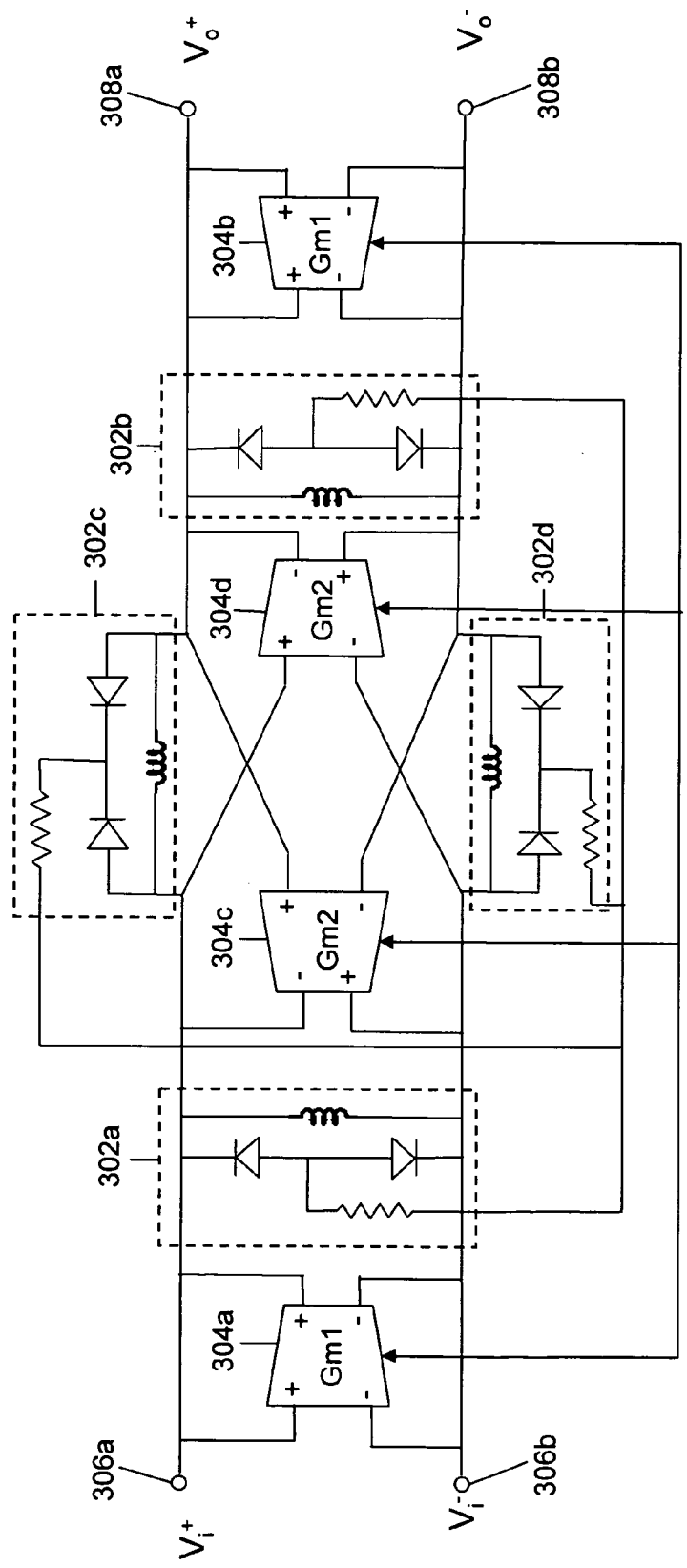
FIG. 3 is a circuit diagram illustrating loss compensation in an IF filter of a double conversion TV tuner, in accordance with an embodiment of the invention.

FIG. 3 is a circuit diagram illustrating loss compensation in an IF filter of a double conversion TV tuner, in accordance with an embodiment of the invention. The figure illustrates the application of the circuit illustrated in FIG. 1 in an IF filter of a double conversion TV tuner. The IF filter includes four LC resonators 302a, 302b, 302c, and 302d, a balanced input port 306, and a balanced output port 308. In accordance with various embodiments of the invention, four transconductors 304a, 304b, 304c, and 304d provide balanced and tunable loss compensation in the IF filter.

In various embodiments of the invention, transconductors 304a and 304b may be SCBTs 102a and 102b. Transconductors 304a and 304b will herein after be referred to as SCBTs 304a and 304b. Similarly, transconductors 304c and 304d may be CCBTs 102c and 102d.

Transconductors 304c and 304d will herein after be referred to as CCBTs 304c and 304d. In an embodiment of the invention, the values of $G_m$ of SCBTs 304a and 304b are different from the values of $G_m$ of CCBTs 304c and 304d.

LC resonators 302a and 302b are connected in a shunt manner across balanced input and output ports 306 and 308, respectively. LC resonator 302a is connected across the two terminals 306a and 306b of balanced input port 306. LC resonator 302b is connected across two terminals 308a and 308b of balanced output port 308. LC resonator 302c is connected in series between positive terminal 306a of input port 306 and positive terminal 308a of output port 308. LC resonator 302d is connected in series between negative terminal 306b of input port 306 and negative terminal 308b of output port 308.

The loss across LC resonators 302a and 302b is balanced as signals at the two ends of LC resonators 302a and 302b have the same amplitude, but are out of phase with each other. The loss across LC resonators 302c and 302d is unbalanced as the signals at the two ends of LC resonators 302c and 302d are unsymmetrical. The compensation of the balanced and unbalanced losses across LC resonators 302a, 302b, 302c, and 302d is explained in conjunction with the following paragraphs.

The losses across LC resonators 302a, 302b, 302c and 302d are compensated by SCBTs 304a and 304b and CCBTs 304c and 304d. The balanced loss across LC resonator 302a is compensated by SCBT 304a. The balanced loss across LC resonator 302b is compensated by SCBT 304b. The unbalanced loss across LC resonator 302c is compensated by SCBT 304a, SCBT 304b, CCBT 304d and CCBT 304c. Similarly, the unbalanced loss across LC resonator 302d is compensated by SCBT 304a, SCBT 304b, CCBT 304c and CCBT 304d. The loss compensation achieved by SCBTs 304a and 304b and CCBTs 304c and 304d is balanced.

Various embodiments of the invention provide an efficient system for loss compensation in an electronic filter. The loss compensation provided by the system is balanced. The system provides loss compensation in an unbalanced structure in an electronic filter. Further, the system provides tunable loss compensation to achieve the desired quality of the filter response. In an embodiment of the invention, the system may be implemented on a single integrated circuit.

While the foregoing is directed to embodiments of the present invention, other and further embodiments of the invention may be devised without departing from the basic scope thereof, and the scope thereof is determined by the claims that follow.

The invention claimed is:

1. A system for providing resistive loss compensation in an electronic filter, the resistive loss being a voltage loss across the electronic filter, the resistive loss comprising a balanced resistive loss and an unbalanced resistive loss, the system comprising:

a set of cross-connected transconductors comprising:

i. a first balanced transconductor, wherein-a positive input terminal of the first balanced transconductor is connected to a positive input terminal of the electronic filter, a negative input terminal of the first balanced transconductor is connected to a negative input terminal of the electronic filter, a positive output terminal of the first balanced transconductor is connected to a negative output terminal of the electronic filter, a negative output terminal of the first balanced transconductor is connected to a positive output terminal of the electronic filter; and ii. a second balanced transconductor, wherein-a positive input terminal of the second balanced transconductor is connected to a positive output terminal of the electronic filter, a negative input terminal of the second balanced transconductor is connected to a negative output terminal of the electronic filter, a positive output terminal of the second balanced transconductor is connected to a negative input terminal of the electronic filter, a negative output terminal of the second balanced transconductor is connected to a positive input terminal of the electronic filter; and a set of self-connected transconductors comprising:

i. a third balanced transconductor, wherein a positive input terminal of the third balanced transconductor and a positive output terminal of the third balanced transconductor is connected to the positive input terminal of the electronic filter, a negative input terminal of the third balanced transconductor and a negative output terminal of the third balanced transconductor is connected to the negative input terminal of the electronic filter; and ii. a fourth balanced transconductor, wherein a positive input terminal of the fourth transconductor and a positive output terminal of the fourth transconductor is connected to the positive output terminal of the electronic filter, a negative input terminal of the fourth balanced transconductor and a negative output terminal of the fourth balanced transconductor is connected to the negative output terminal of the electronic filter;

and wherein the inputs to each of the set of cross-connected transconductors and each of the set of self-connected transconductors are balanced and the set of cross-connected transconductors and the set of self-connected transconductors function as a differential negative resistor to compensate the balanced resistive loss and the unbalanced resistive loss across the electronic filter.

2. The system of claim 1 wherein the set of cross-connected transconductors and the set of self-connected transconductors are tunable.

3. The system of claim 1 wherein the set of cross-connected transconductors and the set of self-connected transconductors comprise at least one cross-coupled pair of transistors.

4. The system of claim 1 wherein the electronic filter comprises at least one of a balanced LC structure and an unbalanced LC structure.

5. The system of claim 4 wherein the balanced LC structure comprises one or more inductors and one or more varactor diodes connected to each other.

6. An IF filter in a double conversion TV tuner utilizing the system of claim 1.

7. The system of claim 4 wherein the unbalanced LC structure comprises one or more inductors and one or more varactor diodes connected to each other.

8. The system of claim 4 wherein the resistive loss across the unbalanced LC structure is unbalanced.

9. The system of claim 4 wherein the resistive loss across the balanced LC structure is balanced.

10. A system for providing resistive loss compensation in an electronic filter, the electronic filter comprising at least one of a balanced LC structure and an unbalanced LC structure, each of the balanced LC structure and the unbalanced LC structure comprising one or more inductors and one or more varactor diodes connected to each other, the resistive loss being voltage loss across the electronic filter, the resistive loss comprising a balanced resistive loss and an unbalanced resistive loss, the system comprising:

a set of cross-connected transconductors comprising:

i. a first balanced transconductor, wherein a positive input terminal of the first balanced transconductor is connected to a positive input terminal of the electronic filter, a negative input terminal of the first balanced transconductor is connected to a negative input terminal of the electronic filter, a positive output terminal of the first balanced transconductor is connected to a negative output terminal of the electronic filter, a negative output terminal of the first balanced transconductor is connected to a positive output terminal of the electronic filter; and ii. a second balanced transconductor, wherein a positive input terminal of the second balanced transconductor is connected to a positive output terminal of the electronic filter, a negative input terminal of the second balanced transconductor is connected to a negative output terminal of the electronic filter, a positive output terminal of the second balanced transconductor is connected to a negative input terminal of the electronic filter, a negative output terminal of the second balanced transconductor is connected to a positive input terminal of the electronic filter; and a set of self-connected transconductors comprising:

i. a third balanced transconductor, wherein a positive input terminal of the third balanced transconductor and a positive output terminal of the third balanced transconductor is connected to the positive input terminal of the electronic filter, a negative input terminal of the third balanced transconductor and a negative output terminal of the third balanced transconductor is connected to the negative input terminal of the electronic filter; and ii. a fourth balanced transconductor, wherein a positive input terminal of the fourth transconductor and a positive output terminal of the fourth transconductor is connected to the positive output terminal of the electronic filter, a negative input terminal of the fourth balanced transconductor and a negative output terminal of the fourth balanced transconductor is connected to the negative output terminal of the electronic filter;

and wherein inputs to each of the set of cross-connected transconductors and each of the set of self-connected transconductors are balanced and the set of cross-connected transconductors and the set of self-connected transconductors function as a differential negative resistor to compensate the balanced resistive loss and the unbalanced resistive loss across the electronic filter.

11. The system of claim 10 wherein the set of cross-connected transconductors and the set of self-connected transconductors are tunable.

12. The system of claim 10 wherein the set of cross-connected transconductors and the set of self-connected transconductors comprise at least one cross-coupled pair of transistors.

13. The system of claim 10 wherein the resistive loss across the unbalanced LC structure is unbalanced.

14. The system of claim 10 wherein the resistive loss across the balanced LC structure is balanced.

15. A system for providing resistive loss compensation in an electronic filter, the electronic filter comprising at least one of a balanced LC structure and an unbalanced LC structure, each of the balanced LC structure and the unbalanced LC structure comprising one or more inductors and one or more varactor diodes connected to each other, the resistive loss being voltage loss across the electronic filter, the resistive loss comprising a balanced resistive loss and an unbalanced resistive loss, the system comprising:

a set of cross-connected transconductors comprising:

i. a first balanced transconductor, wherein a positive input terminal of the first balanced transconductor is connected to a positive input terminal of the electronic filter, a negative input terminal of the first balanced transconductor is connected to a negative input terminal of the electronic filter, a positive output terminal of the first balanced transconductor is connected to a negative output terminal of the electronic filter, a negative output terminal of the first balanced transconductor is connected to a positive output terminal of the electronic filter; and ii. a second balanced transconductor, wherein a positive input terminal of the second balanced transconductor is connected to a positive output terminal of the electronic filter, a negative input terminal of the second balanced transconductor is connected to a negative output terminal of the electronic filter, a positive output terminal of the second balanced transconductor is connected to a negative input terminal of the electronic filter, a negative output terminal of the second balanced transconductor is connected to a positive input terminal of the electronic filter; and a set of self-connected transconductors comprising:
  i. a third balanced transconductor, wherein a positive input terminal of the third balanced transconductor and a positive output terminal of the third balanced transconductor is connected to the positive input terminal of the electronic filter, a negative input terminal of the third balanced transconductor and a negative output terminal of the third balanced transconductor is connected to the negative input terminal of the electronic filter; and
  ii. a fourth balanced transconductor, wherein a positive input terminal of the fourth transconductor and a positive output terminal of the fourth transconductor is connected to the positive output terminal of the electronic filter, a negative input terminal of the fourth balanced transconductor and a negative output terminal of the fourth balanced transconductor is connected to the negative output terminal of the electronic filter;

and wherein the set of cross-connected transconductors and the set of self-connected transconductors are tunable, the inputs to each of the set of cross-connected transconductors and each of the set of self-connected transconductors are balanced and the set of cross-connected transconductors and the set of self-connected transconductors function as a differential negative resistor to compensate the balanced resistive loss and the unbalanced resistive loss across the electronic filter.

* * * * *